(12) United States Patent
Cabanillas (10) Patent No.: US 10,122,326 B2
(45) Date of Patent: Nov. 6, 2018

(54) SYSTEMS AND METHODS PROVIDING LOADLINE MODULATION OF A POWER AMPLIFIER

(71) Applicant: QUALCOMM Incorporated, San Diego, CA (US)

(72) Inventor: Jose Cabanillas, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/472,504

(22) Filed: Mar. 29, 2017

(65) Prior Publication Data

US 2018/0131333 A1 May 10, 2018

Related U.S. Application Data

(60) Provisional application No. 62/417,440, filed on Nov. 4, 2016.

(51) Int. Cl.
| | | |
|---|---|---|
| *H03F 1/34* | (2006.01) | |
| *H03F 1/56* | (2006.01) | |
| *H03F 3/193* | (2006.01) | |
| *H03F 3/21* | (2006.01) | |
| *H03F 1/02* | (2006.01) | |
| *H03F 3/189* | (2006.01) | |
| *H03F 3/24* | (2006.01) | |
| *H04B 1/04* | (2006.01) | |

(52) U.S. Cl.
CPC ............ *H03F 1/56* (2013.01); *H03F 1/0272* (2013.01); *H03F 3/189* (2013.01); *H03F 3/193* (2013.01); *H03F 3/21* (2013.01); *H03F 3/24* (2013.01); *H04B 1/0458* (2013.01); *H03F 2200/102* (2013.01); *H03F 2200/171* (2013.01); *H03F 2200/387* (2013.01); *H03F 2200/451* (2013.01); *H03F 2200/78* (2013.01)

(58) Field of Classification Search
CPC .................................. H03F 1/34; H03F 3/191
USPC ........................................... 330/291, 85, 305
See application file for complete search history.

(56) References Cited

U.S. PATENT DOCUMENTS

| | | | | |
|---|---|---|---|---|
| 3,370,254 | A * | 2/1968 | Keller | .................... H03C 3/222 |
| | | | | 331/117 R |
| 5,378,939 | A * | 1/1995 | Marsland | ............ H01L 27/0605 |
| | | | | 257/E27.012 |
| 6,020,787 | A | 2/2000 | Kim et al. | |
| 6,593,825 | B1 * | 7/2003 | Washburn | ............ H03B 5/1228 |
| | | | | 331/117 FE |

(Continued)

OTHER PUBLICATIONS

Partial International Search Report—PCT/US2017/054781—ISA/EPO—dated Jan. 5, 2018.

(Continued)

*Primary Examiner* — Henry Choe
(74) *Attorney, Agent, or Firm* — Haynes and Boone, LLP (57) ABSTRACT

A circuit including: a power amplifier configured to provide amplified signals to a load; an impedance matching network disposed between the power amplifier and the load, the impedance matching network comprising an adjustable impedance unit; and a feedback loop comprising a rectifier, the rectifier being coupled with an output of the power amplifier, the feedback loop further comprising and impedance control circuit configured to receive a signal from the rectifier and to control the adjustable impedance unit in response to the signal from the rectifier.

15 Claims, 10 Drawing Sheets

(56) References Cited

U.S. PATENT DOCUMENTS

| | | | |
|---|---|---|---|
| 6,806,785 B2* | 10/2004 | Traub | H01L 24/49 |
| | | | 257/531 |
| 6,925,325 B2* | 8/2005 | Yonce | A61B 5/0428 |
| | | | 128/901 |
| 7,482,873 B2* | 1/2009 | Van Bezooijen | H03F 1/0238 |
| | | | 330/278 |
| 7,764,125 B2 | 7/2010 | Dawe | |
| 7,865,154 B2 | 1/2011 | Mendolia et al. | |
| 8,140,030 B2 | 3/2012 | Takinami et al. | |
| 8,346,189 B2 | 1/2013 | Dupuy et al. | |
| 8,718,580 B2 | 5/2014 | Cabrera et al. | |
| 9,425,742 B2* | 8/2016 | Langer | H03F 1/0222 |
| 2003/0146807 A1* | 8/2003 | Higgins | H01P 1/182 |
| | | | 333/157 |
| 2005/0227640 A1 | 10/2005 | Haque et al. | |
| 2011/0043282 A1 | 2/2011 | Drogi et al. | |
| 2011/0269416 A1 | 11/2011 | Kadoi et al. | |
| 2012/0075016 A1 | 3/2012 | Visser et al. | |
| 2013/0187712 A1 | 7/2013 | Cabanillas et al. | |
| 2015/0061404 A1 | 3/2015 | Lamenza et al. | |
| 2015/0091657 A1* | 4/2015 | Gaynor | H03F 3/21 |
| | | | 330/302 |
| 2016/0268988 A1 | 9/2016 | Jeon et al. | |

OTHER PUBLICATIONS

International Search Report and Written Opinion—PCT/US2017/054781—ISA/EPO—dated Feb. 28, 2018.

* cited by examiner

SYSTEMS AND METHODS PROVIDING LOADLINE MODULATION OF A POWER AMPLIFIER

CROSS-REFERENCE TO RELATED APPLICATIONS

The present application claims the benefit of U.S. Provisional Patent Application No. 62/417,440, filed Nov. 4, 2016, and entitled "SYSTEMS AND METHODS PROVIDING LOADLINE MODULATION OF A POWER AMPLIFIER," the disclosure of which is incorporated by reference herein in its entirety.

TECHNICAL FIELD

This application relates to power amplifiers, and more particularly, to loadline modulation of power amplifiers.

BACKGROUND

In an example conventional radio frequency (RF) power amplifier (PA), a transistor receives at its control terminal an RF signal, and it amplifies the RF signal for the load. The load may include a 50 ohm antenna, a duplexer, and or other appropriate components. Continuing with the example, the PA includes a matching network between the transistor and the load, so that a node at the drain of the transistor sees a relatively small impedance, e.g., 3-4 ohms. However, the impedance at the load may change. In an example where the load impedance is 50 ohms, the load impedance may vary from 25 ohms to 75 ohms during normal use.

$$P=(V^2)/(2R) \quad \text{Equation 1}$$

Equation 1 above provides an insight into how the PA operates. P is the output power, V is the voltage swing or AC amplitude at the drain of the transistor, and R is the voltage seen by the node at the drain of the transistor. The matching network matches the impedance so that the impedance seen by the node at the drain of the transistor may be relatively small, and if the output power P is held constant V should also be relatively small. However, insertion loss by the matching network increases as the impedance seen by the node decreases. This hurts the power added efficiency (PAE) of the amplifier. Also, raising the impedance seen by the node would also raise the AC voltage swing, which would decrease linearity. An example measure of linearity includes adjacent channel leakage ratio (ACLR). Therefore, a conventional PA faces the trade-off between efficiency and linearity.

Maintaining efficiency and linearity becomes complicated when, as mentioned above, the impedance at the load may vary during normal use. For instance, if the impedance at the load goes to 75 ohms, that causes the impedance seen by the node to go down and the AC voltage swing to get smaller. Similarly, if the impedance at the load decreases to 25 ohms, that causes the impedance seen by the node to go up and the AC voltage swing to increase.

It would be desirable to make adjustments of the PA system to maintain AC voltage swing and linearity within a desired range, even as impedance at the load may change.

SUMMARY

Various embodiments described herein provide circuits and methods to adjust a loadline impedance of a PA system as the PA system operates. According to one embodiment, a circuit includes: a power amplifier configured to provide amplified signals to a load; an impedance matching network disposed between the power amplifier and the load, the impedance matching network comprising an adjustable impedance unit; and a feedback loop comprising a rectifier, the rectifier being coupled with an output of the power amplifier, the feedback loop further comprising an impedance control circuit configured to receive a signal from the rectifier and to control the adjustable impedance unit in response to the signal from the rectifier.

According to another embodiment, a method performed at a radio frequency (RF) power amplifier (PA) system, the method including: sampling a voltage swing at an output terminal of the PA, wherein the PA provides an amplified RF signal to a load; generating a first control signal in response to the voltage swing; applying the first control signal to a comparator to generate a second control signal, wherein the comparator receives a reference signal corresponding to a voltage swing threshold; and adjusting an impedance of a matching network of the PA in response to the second control signal.

According to another embodiment, a radio frequency (RF) system includes: means for amplifying an RF signal, wherein an output of the amplifying means is coupled with a load having a first impedance; means for matching a second impedance at an output of the amplifying means with the first impedance; means for sampling a voltage at the output of the amplifying means, the means for sampling the voltage further comprising means for outputting a first control signal proportional to a swing of the voltage at the output of the amplifying means; and means for biasing the matching means in response to the first control signal.

According to yet another embodiment, a method performed in a radio frequency (RF) circuit having a power amplifier (PA), the method includes: providing an amplified RF signal from an output terminal of the PA to a load; demodulating the amplified RF signal to generate an envelope signal; processing the envelope signal to generate a control signal that is a function of the envelope signal; and applying the control signal as a bias to an adjustable impedance element of a matching network, wherein the matching network is coupled between the output terminal of the PA and the load.

DESCRIPTION

Circuits and methods for adjusting loadline impedance in a power amplifier (PA) system are provided herein. The circuits and methods adjust the loadline impedance in response to an AC voltage swing level detected at an output of a PA. The voltage swing level at the output of the PA may be related to a loadline impedance seen by the output node of the PA, and the loadline impedance may be affected by changes in impedance of the load, so various embodiments operate to adjust loadline impedance as the impedance of the load changes during operation of the device. Thus, various embodiments may provide for keeping AC swing and linearity within a desired range, as described in more detail below.

For instance, an example system includes a PA coupled to a load and an impedance matching network disposed between the load and the PA. The impedance matching network has an adjustable impedance unit, such as a variable capacitor. The PA system also has a feedback loop with a rectifier. The rectifier may be coupled with an output of the PA, and the rectifier samples a voltage swing at an output terminal of the PA. For instance, in a system in which the PA includes a metal oxide semiconductor (MOS) transistor, the drain of the transistor may be configured as an output terminal of the PA. The rectifier samples the voltage swing level at the drain of the transistor and outputs a rectified signal proportional to the voltage swing level.

In these examples, the signal from the rectifier may be a low-frequency signal, having a frequency much less than the RF frequency. For instance, in some examples, the signal from the rectifier has a frequency corresponding to an envelope frequency. Furthermore, in the examples herein it is understood that it may be appropriate in some applications to employ a low pass filter after the rectifier to remove higher-order components of the rectified signal at RF frequencies and higher, however the low pass filter is omitted from some drawings for ease of illustration.

The rectified signal may be received by another component, such as a comparator. The comparator receives as a reference voltage a signal corresponding to a voltage swing threshold. The comparator compares the received rectified signal with the reference voltage and outputs a control signal in response to comparing the rectified signal and the reference voltage. Continuing with this example, the output of the comparator may be a low-frequency signal, which may be used as a control signal for the adjustable impedance unit. The output of the comparator represents a difference voltage (e.g., sampled voltage minus reference voltage), and the adjustable impedance unit may be selected so that it does not change its impedance substantially if the sampled voltage is less than the reference voltage. However, if the sampled voltage is larger than the reference voltage, then the level of the signal from the comparator may cause the adjustable impedance unit to change its impedance.

Continuing with this example, when resistance of the load goes down, it causes the AC voltage swing at the output of the PA to go up. The feedback loop may be calibrated so that if the AC voltage swing increases past a set threshold, the control signal from the comparator changes the impedance in the matching network to reduce the voltage swing by reducing the impedance seen by the output node.

The threshold of the AC voltage swing may be set at any appropriate level to set a desired balance between efficiency and linearity. Furthermore, the particular adjustment made to the variable impedance unit may be affected by the topology of the matching network itself, so that during design time, a designer may use simulation to choose a desired topology and to choose a desired variable impedance unit to achieve the behavior described above.

Various embodiments described herein may provide one or more advantages over conventional systems. For instance, some conventional systems merely match impedance as the load changes, thereby allowing for a relatively large AC voltage swing. By contrast, various embodiments described herein using a rectifier and a comparator with a threshold voltage may set the threshold voltage appropriately to maintain AC swing and linearity within an acceptable range. Furthermore, various embodiments may use fewer total transistors than would a comparable system having a power detector, as available rectifiers and comparators may be relatively efficient to build and integrate on a semiconductor chip. In fact, some embodiments may include integrating the rectifier and comparator on a same semiconductor chip as the PA. Also, in some embodiments, the ability to match the load line of the amplifier to a load may decrease the requirements of an antenna tuner.

Various embodiments include methods as well. One example embodiment includes sampling the voltage swing at the output terminal of the PA. The method further includes generating a first control signal in response to the voltage swing, where the first control signal may include, e.g., a rectified voltage based on the sample of the voltage swing. The example method further includes applying the first control signal to a comparator to generate a second control signal. The comparator receives a reference signal corresponding to a voltage swing threshold. Or put another way, the comparator receives a reference signal corresponding to a particular loadline impedance threshold, since loadline impedance and voltage swing may be related. The method further includes adjusting the impedance of the matching network of the power amplifier using the second control signal.

One particular embodiment includes operating the control loop to achieve a desired level of linearity. Should an impedance of the load increase above a nominal impedance value (e.g., 50 ohms), that may cause the AC voltage swing at the output of the PA to decrease. In this example, that increases linearity, so the feedback loop may be calibrated so that it does not affect the impedance of the matching network. However, should the impedance of a load decrease below a nominal impedance value, that may cause the AC voltage swing at the output of the PA to increase. Since the increased AC voltage swing would be expected to decrease linearity, the feedback loop may be calibrated to reduce the loadline impedance by an amount that would bring the AC voltage swing down to the threshold level. An example of a threshold level may include a level at or below an AC voltage swing expected when the load is at its nominal impedance (e.g., 50 ohms), and the matching network provides a particular loadline impedance (e.g., 3-4 ohms).

Various embodiments may provide further features. For example, the feedback loop may instead be provided to vary a loadline impedance as an average output power varies. Similarly, the feedback loop may be configured to vary the loadline impedance with an envelope of the RF signal.

Figure 1:
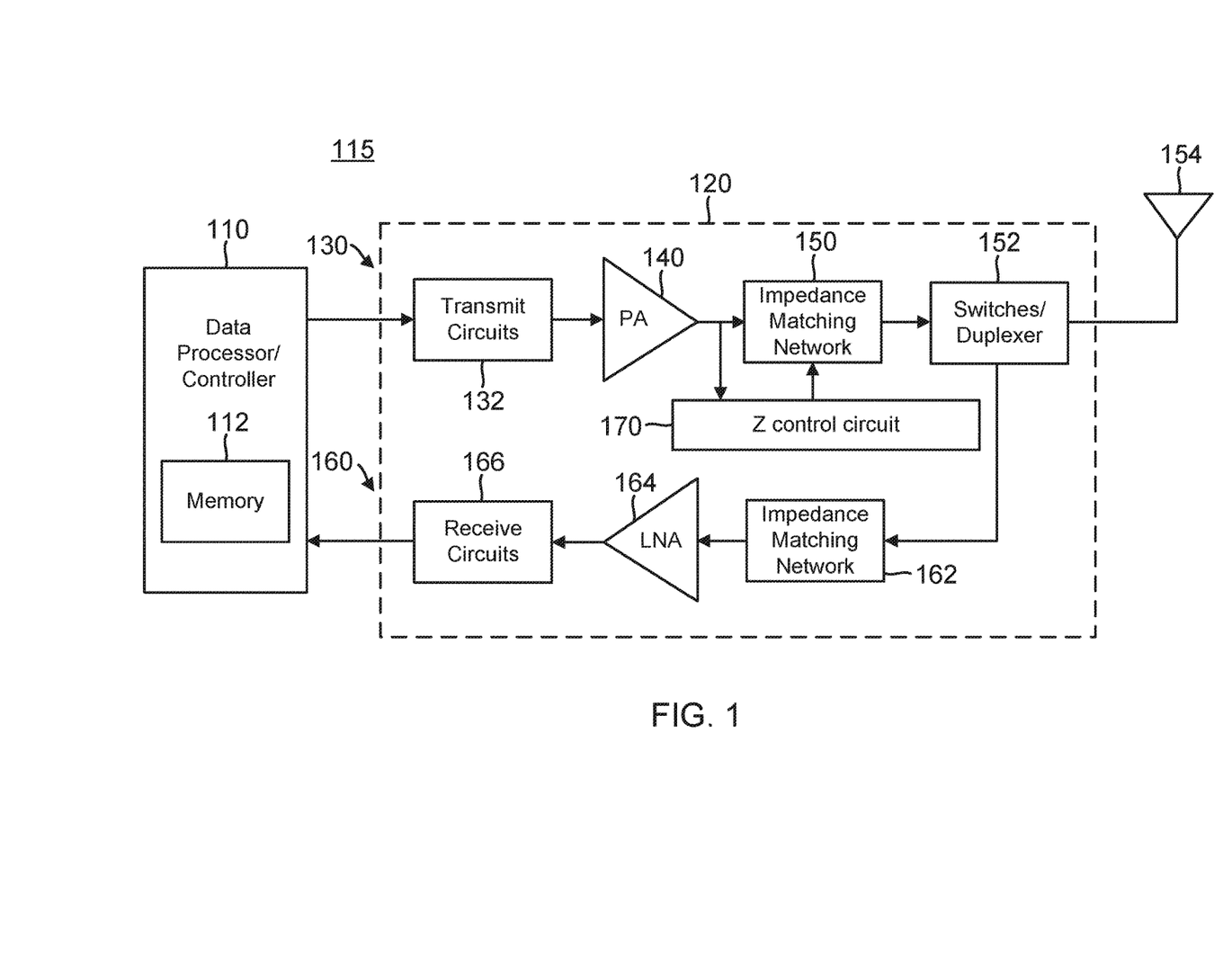
FIG. 1 illustrates an example RF system, in accordance with an embodiment of the disclosure.

Embodiments of the disclosure may be implemented in any of a variety of applications using one or more PAs. In one example, the PA may be implemented in a radio frequency (RF) transceiver in a mobile wireless device. Example wireless devices in which various embodiments may be implemented include smart phones, tablet computers, and the like. The scope of embodiments is not limited to any particular wireless device. FIG. 1 shows a block diagram of an example wireless device 115, according to one embodiment.

In this exemplary design, wireless device 115 includes a data processor/controller 110, a transceiver 120, and an antenna 154. Transceiver 120 includes a transmitter 130 and a receiver 160 that support bi-directional wireless communication. In the transmit path, data processor 110 processes (e.g., encodes and modulates) data to be transmitted and provides an analog output signal to transmitter 130. Within transmitter 130, transmit circuits 132 amplify, filter, and upconvert the analog output signal from baseband to RF and provide an input RF signal. Transmit circuits 132 may include amplifiers, filters, mixers, impedance matching circuits, an oscillator, a local oscillator (LO) generator, a phase locked loop (PLL), etc. A power amplifier (PA) 140 receives and amplifies the input RF signal and provides an amplified RF signal having a proper output power level. An impedance matching network 150 performs output impedance matching for power amplifier 140. Matching network 150 receives the amplified RF signal from power amplifier 140 and provides an output RF signal, which may be routed through switches/duplexer 152 and transmitted via antenna 154.

In the receive path, antenna 154 receives signals from base stations and/or other transmitter stations and provides a received RF signal, which may be routed through switches/duplexer 152 provided to receiver 160. Within receiver 160, an impedance matching network 162 performs input impedance matching for a low noise amplifier (LNA) 164. LNA 164 amplifies the received RF signal from matching network 162 and provides an amplified signal. Receive circuits 166 amplify, filter, and down convert the amplified signal from RF to baseband and provide an analog input signal to data processor 110. Receive circuits 166 may include amplifiers, filters, mixers, impedance matching circuits, an oscillator, an LO generator, a PLL, etc.

FIG. 1 also shows an exemplary design of transmitter 130 and receiver 160. Transmitter 130 and/or receiver 160 may include different and/or additional circuits not shown in FIG. 1. For example, transmitter 130 may include a driver amplifier prior to power amplifier 140. All or a portion of transceiver 120 may be implemented on one or more analog integrated circuits (ICs), RF ICs (RFICs), mixed-signal ICs, etc. For example, transmit circuits 132, power amplifier 140, LNA 164, receive circuits 166, and impedance matching networks 150 and 162 may be implemented on an RFIC. Power amplifier 140 and possibly other circuits may also be implemented on a separate IC or module. Matching network 150 and/or 162 and possibly other circuits may also be implemented on a separate IC or module.

Data processor/controller 110 may perform various functions for wireless device 115. For example, data processor 110 may perform processing for data being transmitted via transmitter 130 and received via receiver 160. Processor 110 may control the operation of transmit circuits 132, receive circuits 166, power amplifier 140, matching network 150 and/or 162, switches/duplexer 152, etc. A memory 112 may store program codes and data for data processor/controller 110. Data processor/controller 110 may be implemented on one or more application specific integrated circuits (ASICs) and/or other ICs.

Of note in the example of FIG. 1 is that impedance matching network 150 may be coupled to impedance control circuit 170 by a feedback loop. The feedback loop samples an AC voltage swing at the output of PA 140 and then controls a variable impedance unit within impedance matching network 150. Examples for implementing PA 140, impedance matching network 150, and impedance control circuit 170 are explained in more detail below.

Figure 2:
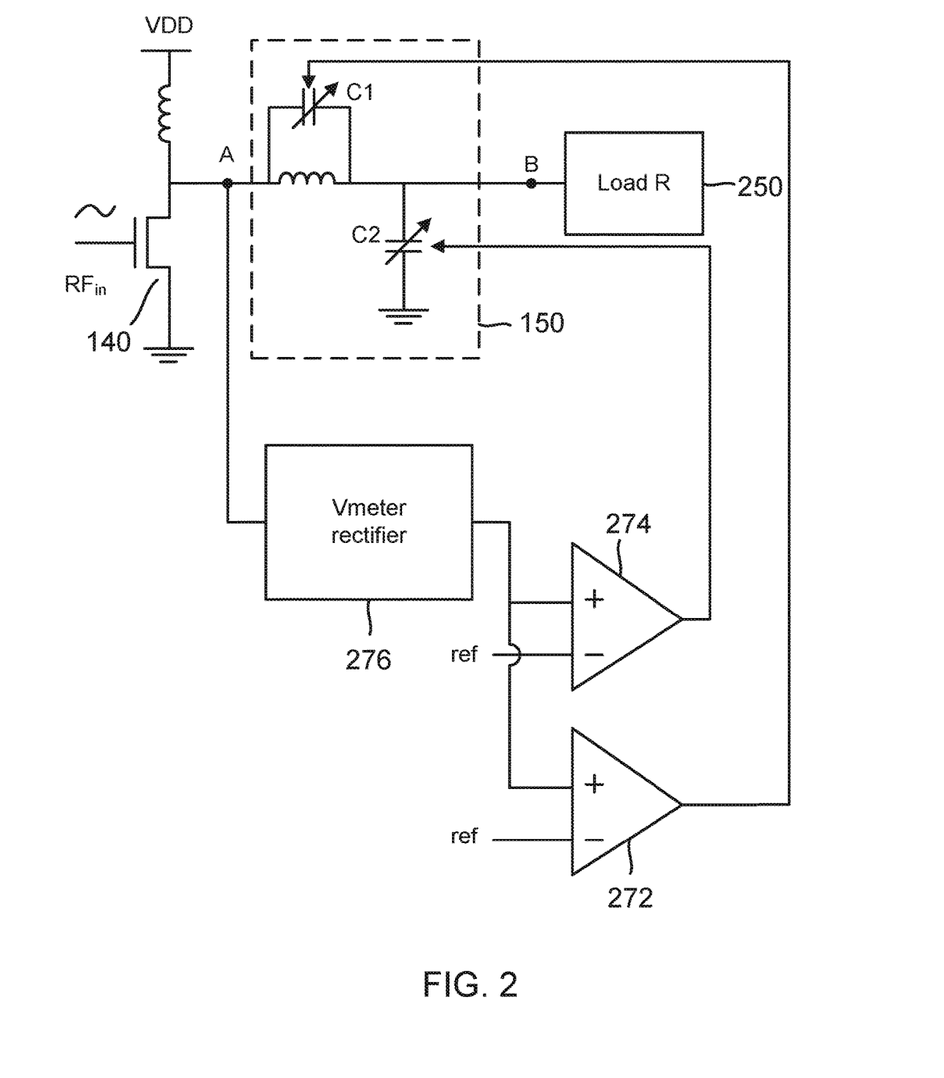
FIG. 2 illustrates an example power amplifier system in accordance with one embodiment of the disclosure.

FIG. 2 is an illustration of an example PA system, according to one embodiment. Specifically, the system of FIG. 2 illustrates one way in which the PA 140, the matching network 150, and the impedance control circuit 170 may be implemented. In this case, the impedance control circuit 170 and the feedback loop with the impedance matching network are illustrated by the rectifier 276 and the comparators 272 and 274.

The PA system of FIG. 2 may be operable to modulate its loadline impedance, where the loadline impedance is the impedance seen by node A. Therefore, the PA system of FIG. 2 may maintain a desired impedance as the impedance at the load 250 varies. In another aspect, the matching impedance may be modulated according to a function of the signal envelope to save power.

The matching network 150 in the RF power amplifier of FIG. 2 includes variable capacitors C1 and C2 (also known as varactors) that may be controlled by the output of the two comparators 272 and 274. The voltage meter rectifier 276 samples the RF AC voltage at node A and rectifies it, producing a rectified output signal. The output of the rectifier 276 may be received at the inputs to the two comparators 272 and 274. The comparators 272 and 274 receive a reference voltage (ref) at their inverting inputs and produce an output voltage that may be proportional to a difference between the rectified signal and the reference voltage. In short, as the AC voltage swing at node A goes up, so does the level of the rectified signal, and so do the output signals from the comparators 270 to 274. In this example, the comparators are shown as op amps, and some embodiments may use a single op amp to control both variable capacitors C1 and C2. The embodiment of FIG. 2 uses different op amps 270 to 274 to control each of the variable capacitors C1 and C2, allowing gain to be set independently at each one of the op amps 272 and 274 to match the characteristics of the individual variable capacitors C1 and C2.

In one example use case, the impedance at the load 250 drops, which results in the AC swing at node A increasing. This results in the signal level at the output of the rectifier 276 to increase as well, and the voltage at the outputs of the comparators 272 and 274 also increases. The control voltages at the outputs of the comparators 272 and 274 may be applied to the variable capacitors C1 and C2 to incrementally decrease the impedance seen by node A, thereby bringing down the AC swing to maintain linearity.

Continuing with the example above, the control voltages may cause the value of C1 to go down and the value of C2 to go up, thereby maintaining the matched impedance. Values of the reference voltage and characteristics of the particular variable capacitors C1 and C2 may be chosen through simulation or experimentation to provide desired operation. For instance, a rise in the impedance at the load may not be harmful to linearity, since it may decrease the AC swing. Therefore, the reference voltage and the variable capacitors C1 and C2 may be chosen to have properties so that the variable capacitors do not change from their nominal capacitance at high load impedances, but as the load impedance drops below a certain threshold (e.g., 50 ohms) the control voltages begin to change the capacitances values of capacitors C1 and C2.

Figure 3:
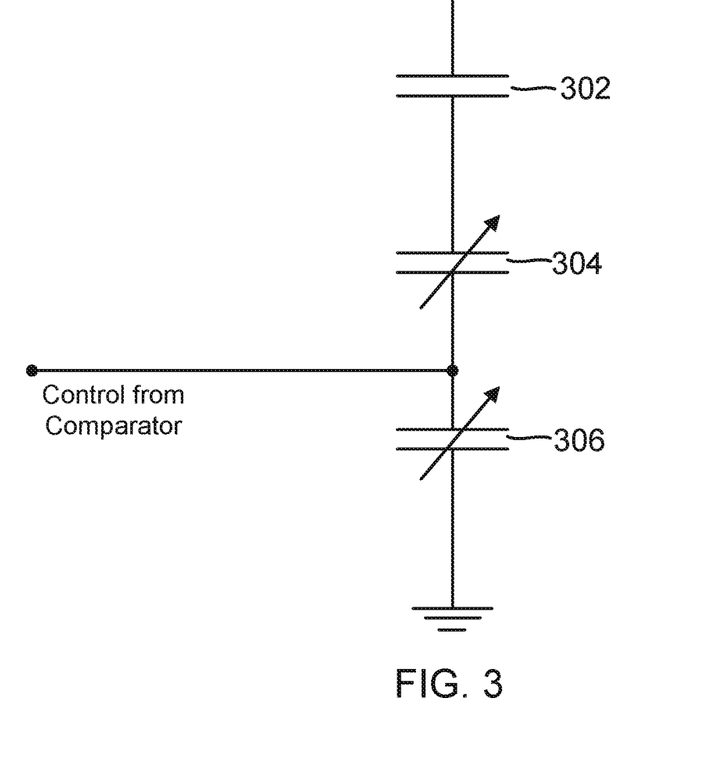
FIG. 3 is an illustration of an example arrangement of variable capacitors that may be used in the embodiment of FIG. 2.

Of course, the arrangement of variable capacitors in FIG. 2 is an example, and it is understood that any appropriate arrangement and number of variable capacitors may be used in various designs. For example, FIG. 3 is an illustration of an example arrangement of variable capacitors that may be used in the embodiment of FIG. 2. For instance, the circuit portion illustrated in FIG. 3 may be adapted for use to provide capacitance C1 or C2 in the circuit of FIG. 2. The example circuit portion illustrated in FIG. 3 includes two variable capacitors 304, 306 and a fixed capacitor 302, and the control voltage from a comparator may be applied to a node between the two variable capacitors 304, 306. FIG. 3 illustrates one way that multiple variable capacitors, and possibly fixed capacitors, may be arranged as appropriate to provide a desired range of impedance values in response to available control signals. The scope of embodiments is not limited to any particular arrangement of variable capacitors nor any particular control signal characteristics.

Also note in FIG. 2 that node A is the drain of the transistor, although the scope of embodiments may use other transistor technologies, such as bipolar junction transistors, GaAs heterojunction bipolar transistors (HBTs), etc.

The scope of embodiments is not limited to the specific circuit shown in FIG. 2. For instance, while FIG. 2 shows the transistor as a PMOS or NMOS transistor, other embodiments may use different kinds of transistor technology, such as bipolar junction transistors or other appropriate transistors. Furthermore, the scope of embodiments is not limited to any particular class of amplifier, as the loadline modulation may be applied to class A, class B, class C, and other amplifiers as appropriate. Similarly, the scope of the embodiments is not limited to a single stage matching network (as shown in FIG. 1 as network 150). For instance, multi-stage LC matching networks or transform-based matching networks could be used.

In the various embodiments described herein, the variable capacitors C1 and C2 themselves may be implemented in any appropriate way, such as by use of a diode that has a voltage-dependent capacitance or use of a trans-cap. In the examples described above, a capacitance value of a variable capacitor may be changed by application of a voltage or current bias.

Furthermore, various embodiments may include adjustable-gain amplifiers for use as the comparators 272, 274 in the embodiment of FIG. 2. For instance, while the output of the comparators 272, 274 may change based on an input received from the rectifier 276, further changes in output may be achieved by adjusting gain at the op amp, which serves as the comparator. In fact, various embodiments may be designed by sweeping values for gain at the comparators 272, 274 and then fixing gain at a level that provides results best suited to a particular application.

Figure 10:
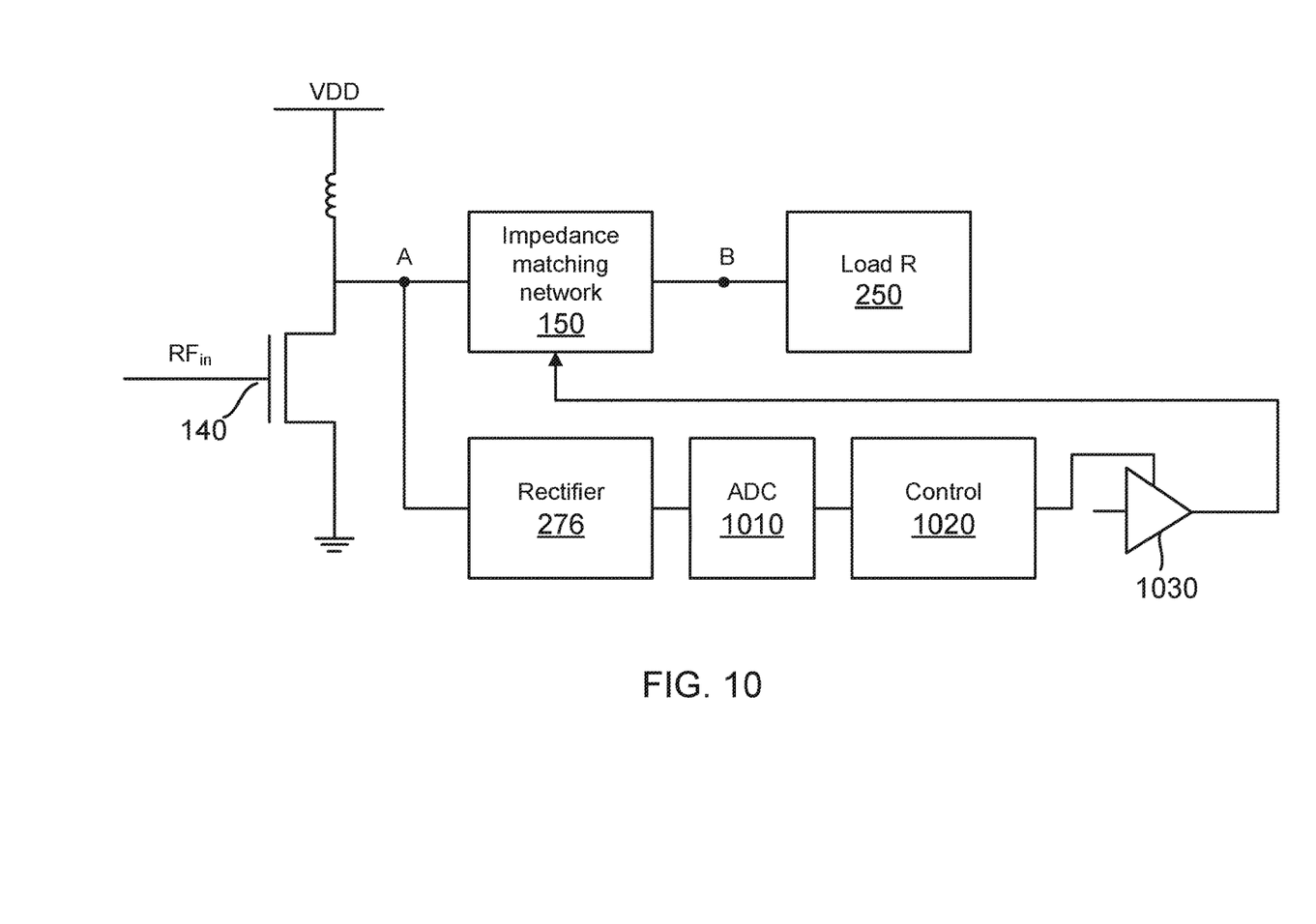
FIG. 10 is an illustration of an example power amplifier system, according to an embodiment of the disclosure.

Furthermore, the PA system of FIG. 2 controls the capacitance values of the variable capacitors C1 and C2 using an analog technique, by virtue of the rectifier 276 and amplifiers 272, 274. However the scope of embodiments is not limited to analog control, as other embodiments may use digital control. For example, the PA system of FIG. 10 implements an analog to digital converter (ADC) 1010 to sample the output of the rectifier 276. Alternatively, other embodiments may use the ADC 1010 to sample the voltage at node A without going through rectifier 276. The data from the ADC 1010 may then be processed by digital impedance control circuit 1020, according to various algorithms. Control logic of circuit 1020 implementing those algorithms may then increase or decrease gain of amplifier 1030, where the output of the amplifier 1030 adjusts a variable capacitor at network 150. Furthermore, in some embodiments, the control logic of circuit 1020 may be implemented at data processor 110 (FIG. 1). In some embodiments the effect of a comparator having a reference voltage input may be programmed in to control circuit 1020 or processor 110. In this manner, bias may be adjusted to reduce the voltage swing when it is above a programmable threshold. This may be used to keep linearity within a desired range.

Figure 4:
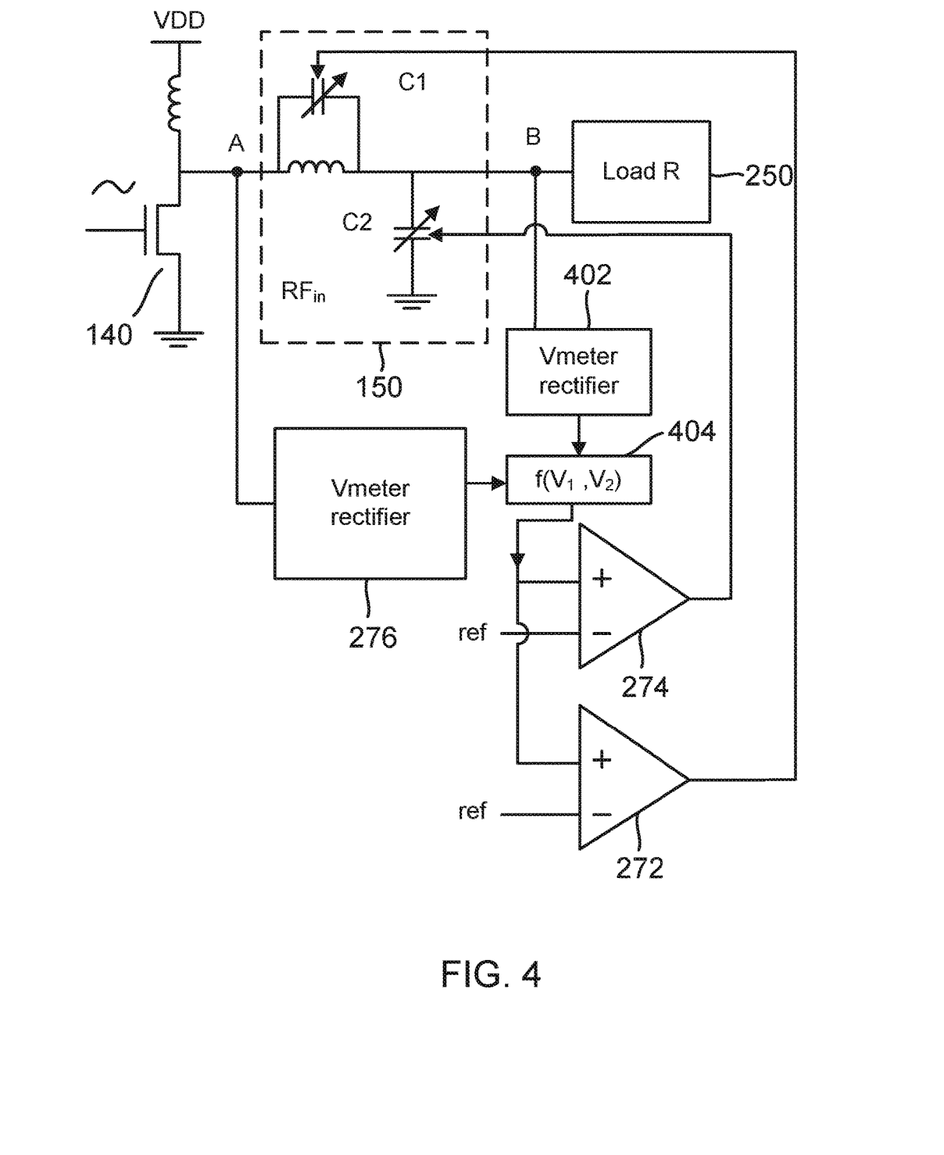
FIG. 4 illustrates an example power amplifier system, according to one embodiment of the disclosure.

The example of FIG. 2 considers looking at the voltage at the drain (node A) after rectification to generate the control signal to the tunable capacitors C1 and C2. However, other embodiments may sense signals at other points to generate additional rectified voltages that can be used to control impedance within the PA system. FIG. 4 is an illustration of an example PA system, according to one embodiment. The embodiment of FIG. 4 may be similar to the embodiment of FIG. 2, though the embodiment of FIG. 4 includes additional features. Specifically, the embodiment of FIG. 4 includes an additional rectifier 402. The embodiment of FIG. 4 also has a weighting block 404 that receives the rectified drain voltage (called V1 in this example) and the rectified load voltage (called V2 in this example) and generates a control voltage that is a function of V1 and V2, f(V1,V2). The control voltage generated by the weighting block may be then applied to the comparators 272 and 274, and the comparators operate as in the example of FIG. 2.

Various embodiments may use any appropriate function at weighting block 404. Furthermore, the functionality of weighting block 404 may be implemented using any combination of hardware or software and may be implemented by the processor 110 of FIG. 1. An advantage of the embodiment of FIG. 4 is that in some instances monitoring more than one point in the signal chain may provide more insight into the actual load impedance when it moves from its nominal value and better facilitate the control of the tunable capacitors.

Figure 5:
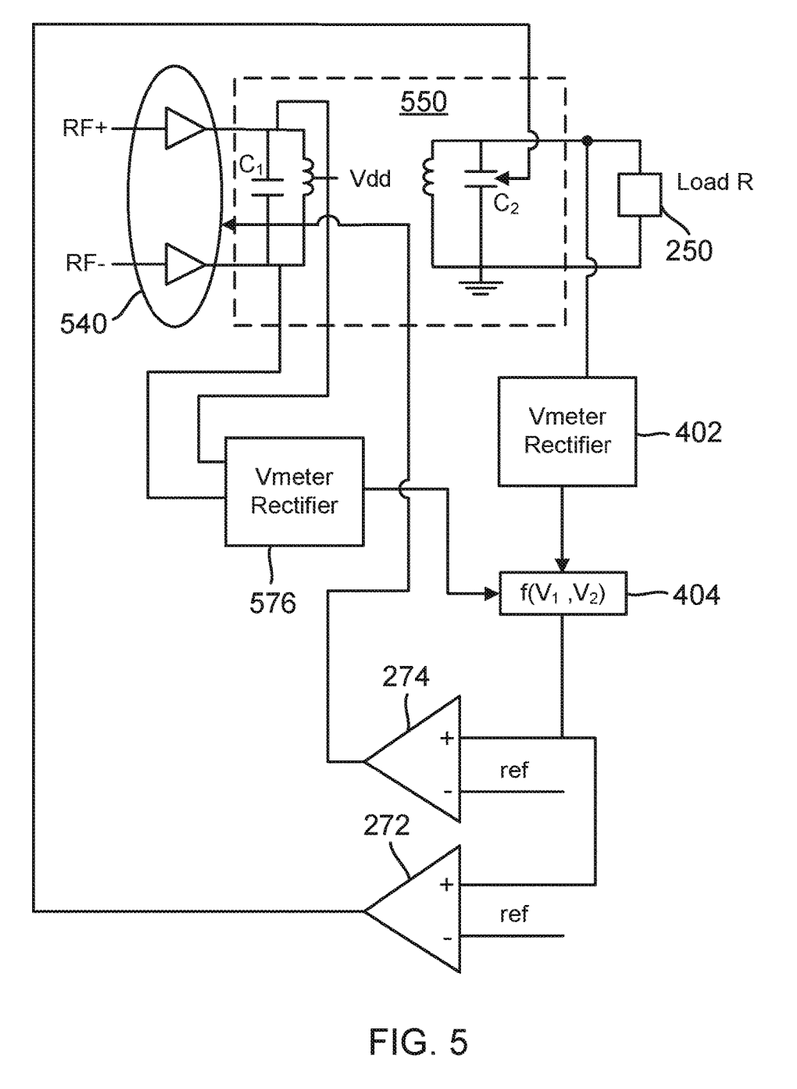
FIG. 5 illustrates an example power amplifier system, according to one embodiment of the disclosure.

FIG. 5 is an illustration of a PA system adapted to handle differential signals, according to one embodiment. Specifically, the embodiment of FIG. 5 may be similar in structure and operation to the embodiment of FIG. 4 but explicitly shows the use of differential signals. PA 540 includes two amplifiers, one receiving the plus component (RF+) of the RF signal, and another one receiving the minus component (RF−) of the RF signal. The matching network 550 may be implemented as a transformer, and the rectifier 576 samples a differential voltage output of the PA 540 and outputs a single-ended rectified voltage. The embodiment shown in FIG. 2 may also be adapted to handle differential signals as well.

Moreover, the embodiments above may sample an RF voltage, producing a rectified voltage by rectifiers 276 or 576. However, the scope of embodiments is not limited to producing rectified voltage signals. In other embodiments, rectifiers 276 and 576 generate a rectified current that may be then compared with a reference current to control the variable impedance unit.

Other embodiments may scale to accommodate more or fewer variable impedance units. For instance, an embodiment having more three or more variable impedance units may include three or more comparators, each of the comparators corresponding to one of the variable impedance units. However, some embodiments may control multiple variable impedance units using a same comparator. In other words, in some embodiments there may be a ratio of variable impedance units to comparators that is different than one-to-one, although other embodiments may use a one-to-one ratio.

Figure 6:
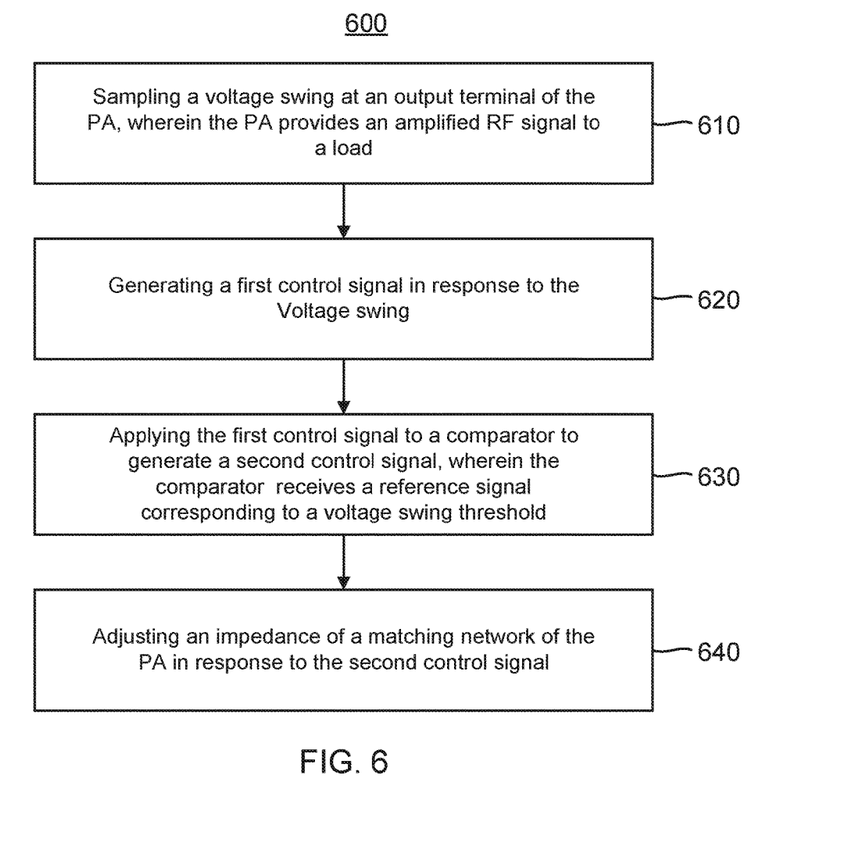
FIG. 6 is an illustration of an example method to be performed with the systems of FIGS. 1-5 and 10, according to an embodiment of the disclosure.

FIG. 6 is an illustration of an example method 600 in which the systems of FIGS. 1-5 and 9 may be used, according to various embodiments. For instance, the actions 610-640 of method 600 may be performed by an impedance control unit and a feedback loop, such as illustrated at FIGS. 1-5 and 9.

At action 610, the system samples a voltage swing at an output terminal of the PA. The PA provides an amplified RF signal to a load. An example is shown at FIG. 2, in which the PA 140 includes a transistor that receives an RF signal (RFin) and amplifies that RF signal for delivery to load 250. The output terminal of the PA 140 is shown as node A and FIG. 2. The rectifier 276 receives at its output the voltage at node A.

At action 620, the system generates a first control signal in response to the voltage swing. For example, in the system of FIG. 2, the rectifier 276 generates either a rectified voltage signal or a rectified current signal as a first control signal. In this example, the first control signal has an amplitude proportional to the voltage swing level at node A. Action 620 may also include low-pass filtering the rectified signal to remove high-frequency components.

At action 630, the system applies the first control signal to a comparator. The comparator generates a second control signal. An example is shown at FIG. 2, in which comparators 272 and 274 receive the first control signal, and the comparators 272 and 274 generate bias signals for the variable capacitors C1 and C2.

Further at action 630, the comparator receives a reference signal corresponding to a voltage swing threshold. In the example of FIG. 2, the reference signal is labeled "ref." The reference signal, ref, may be determined at design time in one example so that it corresponds to a voltage swing threshold. Thus, the resulting voltage or current bias from the particular comparator does not substantially affect an impedance of the impedance matching network when the rectified signal has a smaller value than the reference signal. However, when the rectified signal has a larger value than the reference signal, the bias output from the comparator may be designed to have a value that would substantially affect the impedance of the impedance matching network.

At action 640, the impedance control circuit adjusts an impedance of the matching network of the PA in response to the second control signal. In the example of FIG. 2, the voltage bias from comparator 272 adjusts the capacitance value of the variable capacitor C1. Similarly, the voltage bias from comparator 274 adjusts the capacitance value of the variable capacitor C2. In the example of FIG. 2, the feedback loop may be calibrated during design time so that changes in the swing voltage at node A, which are higher than a threshold, result in changes in the impedance matching network to reduce the swing voltage. Thus, the feedback loop may compensate for the load impedance changes by modulating the loadline to achieve a desired value or range of linearity. Of course, the particular swing voltage threshold may be chosen to be any particular value, and in some embodiments it may be chosen to correspond to a particular expected value for linearity, such as measured in adjacent channel leakage ratio (ACLR).

The scope of embodiments is not limited to the particular actions shown in method 600. Rather, other embodiments may add, omit, rearrange, or modify one or more actions.

For instance, actions 610-640 may be performed continuously or at set intervals during normal operation of a PA.

Figure 7:
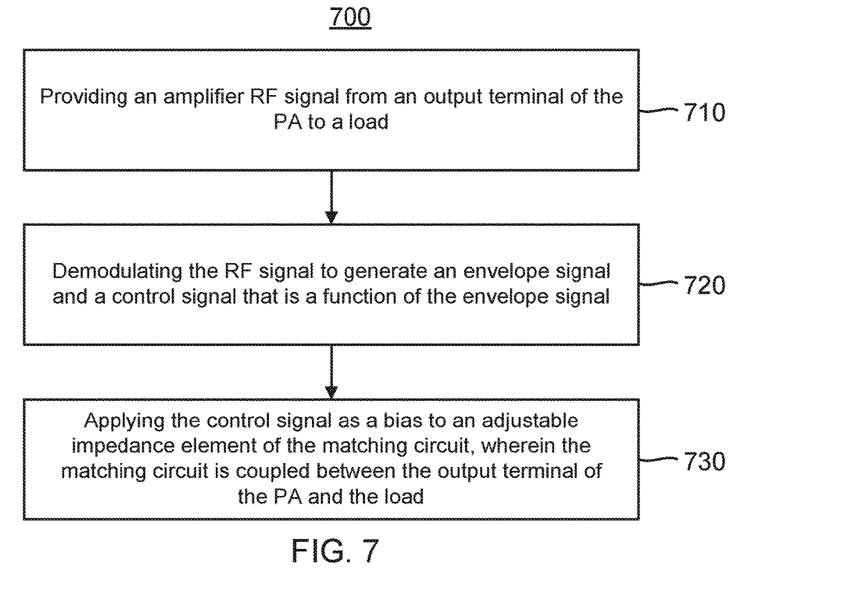
FIG. 7 is an illustration of an example method to be performed with the system of FIG. 8, according to an embodiment of the disclosure.

An aspect of some embodiments is that they may modulate the impedance seen at node A similarly to average power tracking (APT) or envelope tracking (ET). Such feature is described with respect to FIGS. 7 and 8. FIG. 7 is an illustration of method 700, adapted according to one embodiment. Method 700 may be performed by a system, such as the exemplary system of FIG. 8.

In typical APT, a supply voltage (VDD) to a PA may be adjusted up or down, either continuously or in discrete steps, according to an average value of the signal at node A to maintain efficiency and linearity during operation. Similarly, in typical ET, the supply voltage VDD to a PA may be modulated according to the baseband component (envelope) to maintain linearity and efficiency.

In conventional ET and APT, as output power increases, so does the voltage of the power supply (and vice versa). One potential difference between an APT system and an ET system may be the speed at which the VDD supply voltage is changed. In conventional APT a value of the supply voltage may be used independently of the instantaneous value of the envelope, and a highest value of the envelope may then drive the VDD supply voltage. In a conventional ET system, the VDD supply voltage may track the envelope itself.

Notice once again Equation 1: V is related to the supply voltage, assuming constant current through the transistor of the PA 140 to ground. Equation 1 indicates that instead of modulating a supply voltage, the system of FIG. 8 may modulate the impedance (R) seen at node A to achieve a similar result.

Method 700 is provided to illustrate that loadline impedance may be modulated to perform APT or ET. In short, the baseband portion of the RF signal (the envelope) may correspond to the voltage swing at node A. The voltage swing at node A may also be related to the source voltage VDD. While conventional ET may be used to modulate VDD according to the envelope, the embodiment of FIGS. 7 and 8 modulates the loadline impedance according to a function of the envelope.

Figure 8:
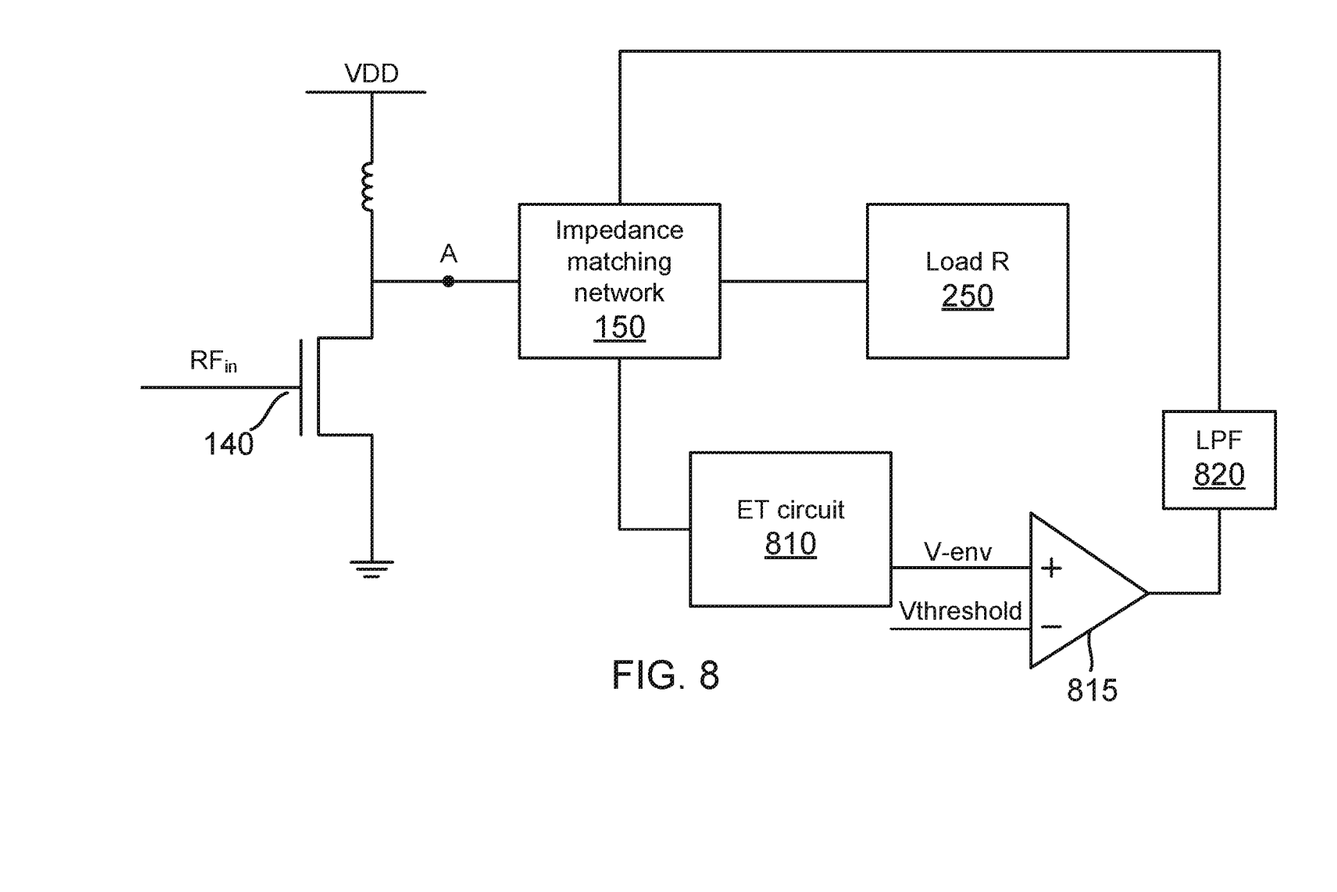
FIG. 8 is an illustration of an example power amplifier system, according to an embodiment of the disclosure.

At action 710, the PA provides an amplified RF signal from its output to a load. An example is shown in FIG. 8, where PA 140 amplifies the RF signal for load 250. Matching network 150 may be disposed between load 250 and node A, as in the other examples above.

At action 720, ET circuit 810 processes the RF signal to generate the envelope signal, and the comparator 815 generates a control signal as function of the envelope. In the example of FIG. 8, ET circuit 810 samples the signal at node A and then generates demodulated signal. ET circuit 810 in this example may include a mixer to perform demodulation. In another example, ET circuit 810 may include a rectifier or other appropriate circuit to generate the envelope signal from the input RF signal. Further in the example, the envelope (V_env) may be compared to a threshold so that the control signal is the greater of V_env and Vthreshold, where V_env represents the instantaneous envelope voltage and Vthreshold may be a reference voltage. This is shown at comparator 815. Vthreshold and the adjustable impedance elements of matching network 150 may be chosen to have properties so that the adjustable impedance elements do not change from their nominal impedance values at high load impedances, but as the load impedance drops below a certain threshold (e.g., 50 ohms) the control voltages begin to change the impedance values in the matching network 150.

Figure 9:
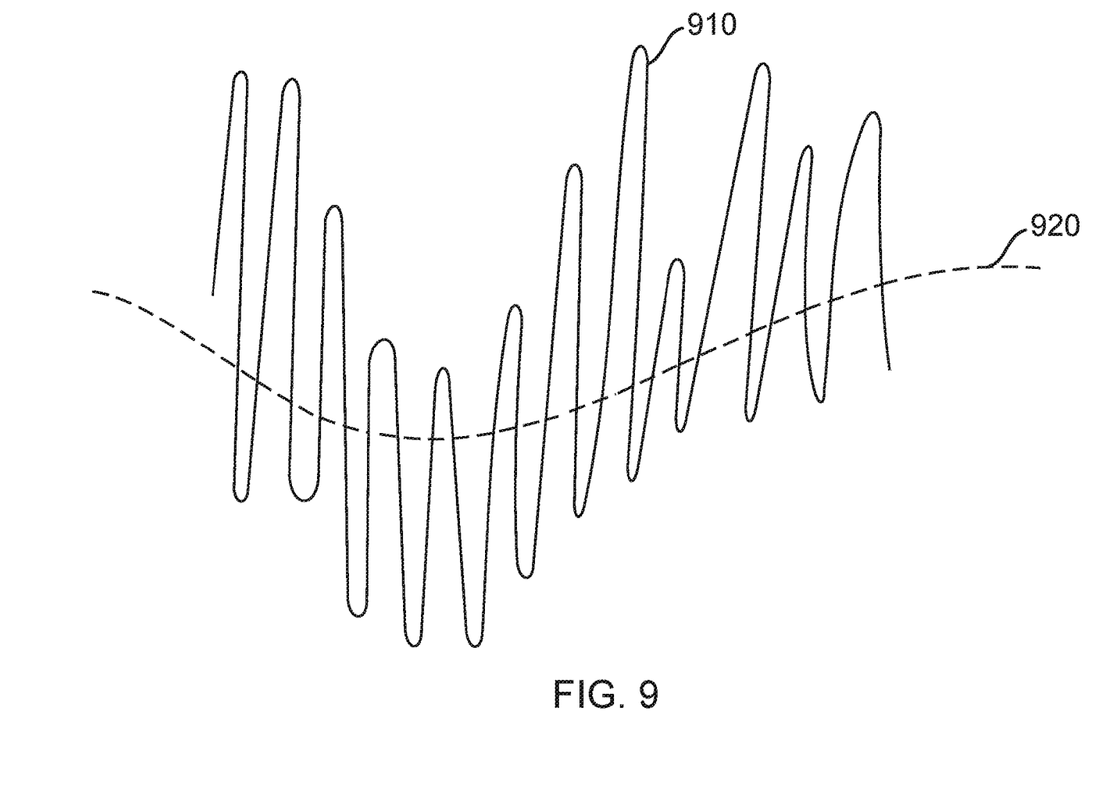
FIG. 9 is an illustration of an example envelope signal and an example low pass filtered control signal, according to an embodiment of the disclosure.

At action 730, the control signal is applied as a bias to an adjustable impedance element of the matching network. In an APT embodiment, the control signal may be passed through the low pass filter (LPF) 820 to substantially reduce the higher frequency components of the envelope signal. The result may include the control signal, after LPF 820, having a waveform that approximates an average of the baseband signal. An example is shown at FIG. 9, where waveform 910 provides an illustration of an example envelope signal, and waveform 920 provides an illustration of an example control signal after LPF 820 in an APT embodiment. In an ET embodiment, LPF 820 may be omitted or may be configured so that it attenuates unwanted harmonics but substantially passes the baseband signal itself unattenuated.

In the example of FIG. 8, the control signal may be applied to the impedance matching network 150. Specifically, the control signal may be applied to an adjustable impedance element, such as a variable capacitor, to adjust the loadline impedance seen at node A. The matching network 150, the ET circuit 810, Vthreshold, and LPF 820 may be configured so that changes in amplitude in the envelope result in corresponding changes to the loadline impedance seen at node A. For instance, when the amplitude of the envelope signal crosses Vthreshold, the control signal from comparator 815 controls the impedance of impedance matching network 150 to cause the impedance seen at node A to decrease. One difference between APT and ET is that APT may be performed with respect to a lower frequency control signal than the envelope itself over a relatively large number of clock cycles. By contrast, ET is performed within a span of time consistent with changing values in the baseband signal. In other words, it is generally the case that ET would modulate the loadline impedance much more quickly than would APT.

An advantage of some embodiments is that APT or ET performed according to the embodiments of FIGS. 7 and 8 may also include maintaining linearity within a desired range by setting Vthreshold accordingly. In one aspect, such embodiments may preserve efficiency by virtue of setting Vthreshold at an acceptable level. Specifically, while the embodiment of FIG. 7 may adjust the load line impedance when V_env is above Vthreshold (thereby reducing efficiency), such embodiments may avoid adjusting the load line impedance when V_env is below Vthreshold. Accordingly, during design time, a designer may set the threshold to maintain a desired balance between efficiency and linearity.

The scope of embodiments is not limited to the method 700 of FIG. 7. Rather, various embodiments may add, omit, rearrange, or modify one or more actions. For instance, method 700 may be performed continuously or at regular intervals during normal operation of an RF amplifier.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit comprising:
a power amplifier configured to provide amplified signals to a load;
an impedance matching network disposed between the power amplifier and the load, the impedance matching network comprising an adjustable impedance unit; and
a feedback loop comprising a rectifier, the rectifier being coupled with an output of the power amplifier, the feedback loop further comprising an impedance control circuit configured to receive a signal from the rectifier and to control the adjustable impedance unit in response to the signal from the rectifier, wherein the impedance control circuit comprises a weighting block configured to receive a rectified load voltage, and configured to generate a control signal for the adjustable impedance unit that is a function of the signal from the rectifier and the rectified load voltage.

2. The circuit of claim 1, wherein the impedance control circuit comprises a comparator, wherein the comparator is configured to receive a reference voltage corresponding to a voltage swing level at the output of the power amplifier and configured to receive the signal from the rectifier.

3. The circuit of claim 1, wherein the adjustable impedance unit comprises a variable capacitor coupled with the impedance control circuit.

4. The circuit of claim 3, wherein the variable capacitor comprises one of a diode having a voltage-dependent capacitance or a trans-cap.

5. The circuit of claim 1, wherein the power amplifier is configured to provide an amplified radio frequency (RF) signal to the load.

6. The circuit of claim 1, wherein the signal from the rectifier comprises one of a voltage signal or a current signal.

7. The circuit of claim 1, wherein the power amplifier comprises a metal oxide semiconductor (MOS) transistor, and wherein the impedance matching network is coupled with a drain of the MOS transistor.

8. The circuit of claim 1, wherein a voltage at the output of the power amplifier comprises a differential voltage.

9. The circuit of claim 1, wherein the load comprises an antenna.

10. A method performed at a radio frequency (RF) power amplifier (PA) system, the method comprising:
sampling a voltage swing at an output terminal of the PA, wherein the PA provides an amplified RF signal to a load;
generating a first control signal in response to the voltage swing;
applying the first control signal to a comparator to generate a second control signal, wherein the comparator receives a reference signal corresponding to a voltage swing threshold; and
adjusting an impedance of a matching network of the PA in response to the second control signal, wherein generating the first control signal comprises:
receiving a first rectified voltage from a first rectifier sampling the voltage swing;
receiving a second rectified voltage from a second rectifier sampling a voltage at the load; and
generating the first control signal as a function of the first rectified voltage and the second rectified voltage.

11. The method of claim 10, wherein generating a first control signal comprises:
rectifying a voltage signal from the output terminal of the PA.

12. The method of claim 10, wherein adjusting the impedance of the matching network comprises:
biasing a variable capacitor of the matching network in response to the second control signal.

13. The method of claim 10, wherein sampling a voltage swing comprises:
sampling a differential voltage at the output terminal of the PA.

14. The method of claim 10, further comprising:
receiving an RF signal at an input of the PA;
amplifying the RF signal by the PA; and
providing an amplified RF signal from the output terminal of the PA to the load.

15. A method performed in a radio frequency (RF) circuit having a power amplifier (PA), the method comprising:
providing an amplified RF signal from an output terminal of the PA to a load;
demodulating the amplified RF signal to generate an envelope signal;
processing the envelope signal to generate a control signal that is a function of the envelope signal; and
applying the control signal as a bias to an adjustable impedance element of a matching network, wherein the matching network is coupled between the output terminal of the PA and the load, further comprising applying a low pass filter to the control signal before applying the control signal as the bias to the adjustable impedance element.

* * * * *